(12) United States Patent
Yin et al.

(10) Patent No.: US 6,936,539 B2
(45) Date of Patent: Aug. 30, 2005

(54) ANTIREFLECTIVE COATING FOR USE DURING THE MANUFACTURE OF A SEMICONDUCTOR DEVICE

(75) Inventors: Zhiping Yin, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/671,186

(22) Filed: Sep. 24, 2003

(65) Prior Publication Data

US 2005/0064718 A1 Mar. 24, 2005

(51) Int. Cl.[7] .............................................. H01L 21/302
(52) U.S. Cl. ....................... 438/689; 438/636; 438/710; 438/711
(58) Field of Search ................................ 438/689, 621, 438/636, 710–711

(56) References Cited

U.S. PATENT DOCUMENTS

| 4,675,265 | A | 6/1987 | Kazama et al. ............... 430/67 |
| 6,333,255 | B1 | 12/2001 | Sekiguchi .................... 438/622 |
| 6,469,425 | B1 | 10/2002 | Sakai et al. .................. 313/310 |
| 6,750,127 | B1 * | 6/2004 | Chang et al. ................ 438/585 |
| 2002/0088707 | A1 * | 7/2002 | Towle .................... 204/192.15 |

OTHER PUBLICATIONS

Copending Application: "Boron–Doped Amorphous Carbon Film For Use as a Hard Etch Mask During the Formation of a Semiconductor Device", U.S. Appl. No. 10/463,185, filed Jun. 17, 2003.

* cited by examiner

Primary Examiner—Thanh Nguyen
(74) Attorney, Agent, or Firm—Kevin D. Martin

(57) ABSTRACT

An antireflective layer formed from boron-doped amorphous carbon can be removed using a process which is less likely to over etch a dielectric layer than conventional technology. This layer can be removed by exposing the layer to an oxygen plasma (i.e. an "ashing" process), preferably concurrently with the ashing and removal of an overlying photoresist layer. An inventive process which uses the inventive antireflective layer is also described.

21 Claims, 10 Drawing Sheets

ANTIREFLECTIVE COATING FOR USE DURING THE MANUFACTURE OF A SEMICONDUCTOR DEVICE

FIELD OF THE INVENTION

This invention relates to the field of semiconductor manufacture and, more particularly, to an antireflective coating for use during the manufacture of a semiconductor device, specifically during a photolithographic process.

BACKGROUND OF THE INVENTION

During the formation of a semiconductor device such as memory devices, logic devices, microprocessors, etc., several photolithography steps are typically required. Each photolithography step includes the formation of a blanket photoresist (resist) layer, exposing portions of the resist layer to light using a mask or reticle, removing the exposed resist portions (or the unexposed resist portions if negative resist is used), etching the underlying layer using the resist as a pattern, then stripping the resist.

Many layers, for example some oxides and metals, have a highly polished surface which reflects light back to the photoresist and exposes the resist in unwanted areas. This unintentionally exposed portion of the photoresist is removed (or remains, in the case of negative resist) and results in less than desirable patterning of the underlying layer. One method used to decrease reflected light is through the use of dielectric antireflective coatings (DARC layers), which are well known in the art of photolithography. A DARC layer is formed as a blanket layer, typically from silicon-rich oxide or oxynitride using chemical vapor deposition (CVD), over the layer to be etched. The blanket resist layer is formed over the DARC layer, then exposed to a pattern of light projected through a reticle. The exposed portion of the resist (or the unexposed portion, if a negative resist is used) is removed. Next, the DARC layer and the underlying layer are etched using the resist as a pattern. After patterning the DARC layer and the underlying layer, both the resist and DARC layers are typically removed. The resist is removed using an ash step comprising exposure of the resist to an oxygen plasma, then DARC layer is removed, typically using a wet etch but also in some processes using a dry etch.

One problem which can result from the use of DARC layers occurs from the removal of the layer. The DARC layer is typically exposed to a wet etch of SuperQ (3% phosphoric acid, $H_3PO_4$, 37% ammonium fluoride, $NH_4F$) or QEtch II (1% $H_3PO_4$, 39% $NH_4F$). This wet etch also enters the opening in the underlying layer, and may etch this layer and expand the opening in the underlying layer beyond that etched with the photoresist pattern. This expansion may also occur if the DARC layer is removed with a dry etch. In many device designs this will undesirably expose another conductive feature, which may lead to shorting when the opening is filled with a conductive layer which contacts the exposed feature. This is especially true as semiconductor engineers design devices with tight critical dimensions (CD's) to maximize feature density. This may result in an unreliable device or a nonfunctional device, thereby decreasing yields and increasing costs. While the DARC layer is nonconductive, leaving it in place can contribute to device leakage.

A process which results in the aforementioned shorting of device features is depicted in FIGS. 1–5. FIG. 1 depicts a conventional structure comprising a semiconductor wafer 10 having doped regions therein 12, shallow trench isolation (STI) 14, transistors comprising gate oxide 16, control gate 18, for example polysilicon, conductive enhancement layer 20, for example tungsten silicide, capping layer 22, and dielectric spacers 24. FIG. 1 further depicts conductive pads 25, dielectric base layer 26, for example borophosphosilicate glass (BPSG), storage capacitors comprising capacitor bottom plate 28, cell dielectric 30, and capacitor top plate layer 32. FIG. 1 further depicts a second dielectric layer 34 comprising BPSG or tetraethyl orthosilicate (TEOS), an antireflective coating (ARC) 36, for example manufactured from silicon-rich oxide or oxynitride, and a patterned photoresist layer 38. During the exposure of photoresist layer 38 during photolithography, antireflective layer 36 decreases the reflection of light from the surface of dielectric layer 34 back into resist layer 38. The structure of FIG. 1 is easily manufactured by one of ordinary skill in the art from the information herein. Other structures may be formed during the manufacture of the structure of FIG. 1 which are not depicted for ease of explanation.

After forming the FIG. 1 structure, an etch is performed using the photoresist layer 38 as a pattern to remove portions of ARC layer 36, dielectric 34, and base dielectric 26 to expose conductive pad 25. This forms the digit line contact opening 40 as depicted in FIG. 2.

After etching the digit line contact opening 40, resist layer 38 is removed, for example using an ash step (i.e. exposing the layer to an oxygen plasma) followed by a clean using a dilute solution of hydrogen peroxide ($H_2O_2$) and sulfuric acid ($H_2SO_4$) to remove any remaining residue to result in the FIG. 3 structure. Next, the ARC layer is removed, for example by exposing the ARC layer to a wet etch comprising SuperQ or QEtch II, which also exposes the base dielectric 26 and conductive pad 25 to the wet etch. During removal of the ARC layer, the base dielectric layer 26 may also be etched which results in the structure of FIG. 4. In FIG. 4, the capacitor storage plate 28 is exposed which will result in shorting of the storage plate 28 with a plug layer 50 formed within contact opening 40 as depicted in FIG. 5.

A new method and structure which reduces or eliminates the problems resulting from removing an antireflective layer with a wet or dry etch would be desirable.

SUMMARY OF THE INVENTION

An embodiment of the present invention provides a new method which, among other advantages, reduces problems associated with the manufacture of semiconductor devices, particularly problems resulting from the removal of a deposited antireflective coating (DARC) with a wet or dry etch.

In accordance with one embodiment of the invention a layer of boron-doped amorphous carbon (herein "a-C:B") is used as a DARC layer. This a-C:B layer as a DARC layer, in contrast to conventional DARC layers, has the advantage of being removable through an ashing process, similar to that used for removal of photoresist. One advantage is that the DARC layer can be removed without a wet etch, and it may be removed simultaneously with the removal of an overlying photoresist layer.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
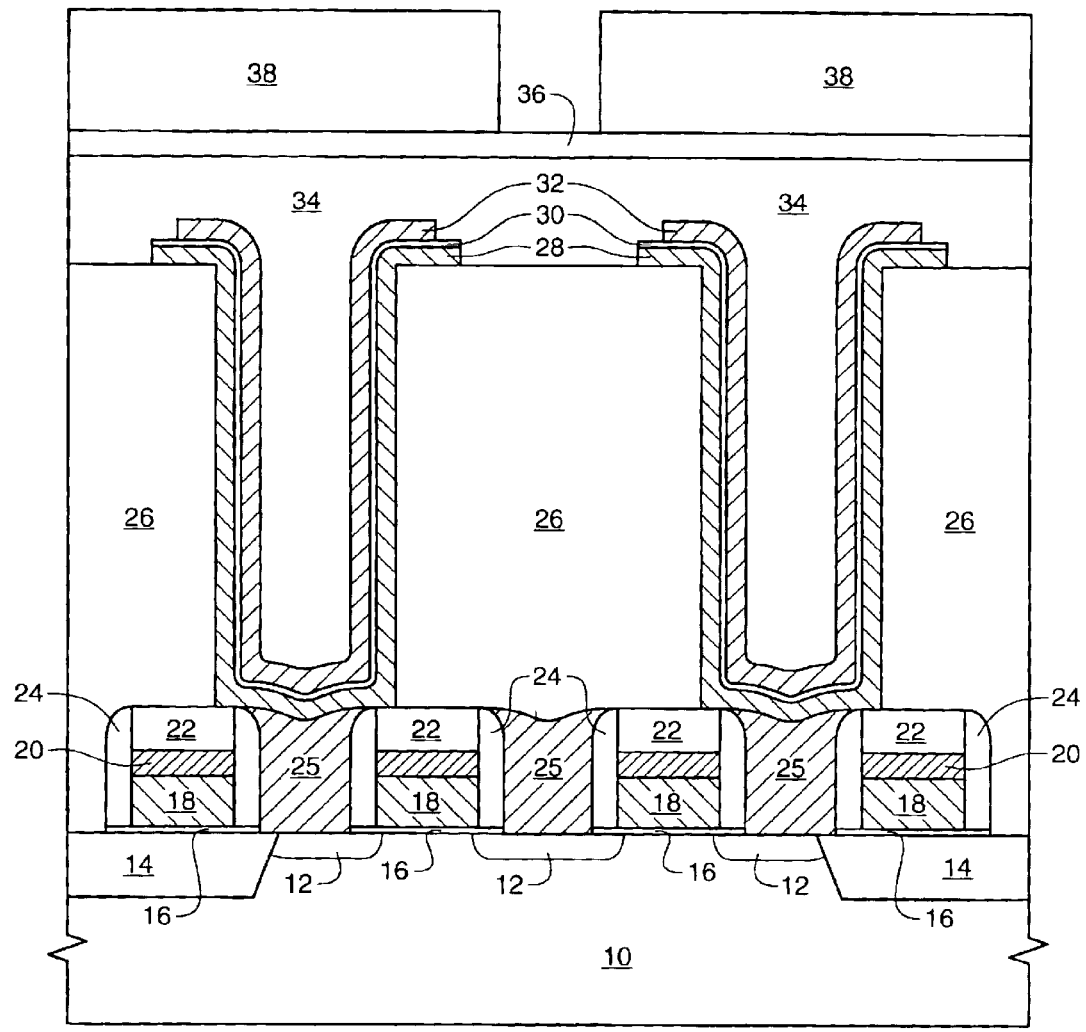
FIGS. 1–5 are cross sections depicting a conventional process which results in the etching of a dielectric layer during removal of an antireflective coating, which exposes a capacitor bottom plate.
Figure 2:
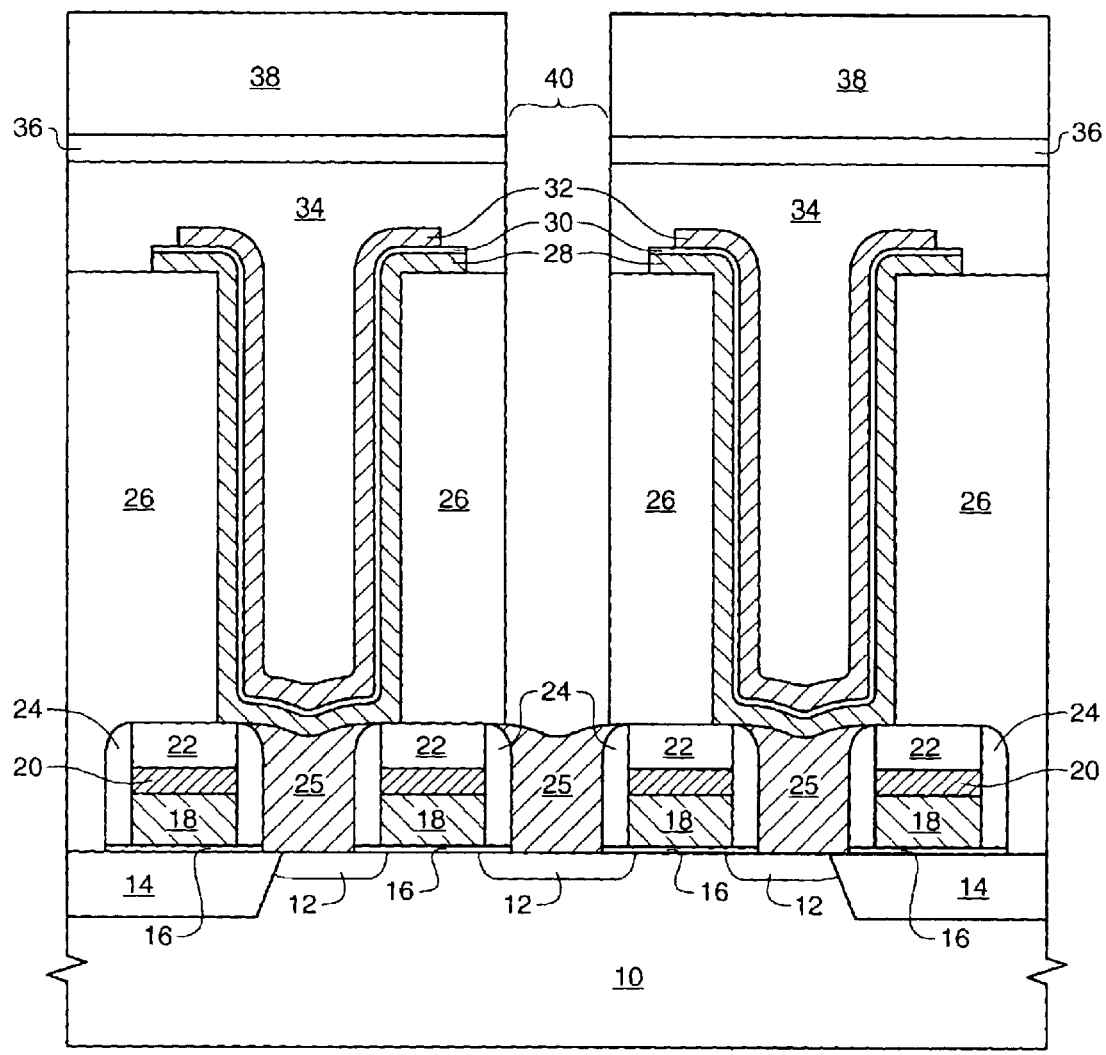
Figure 3:
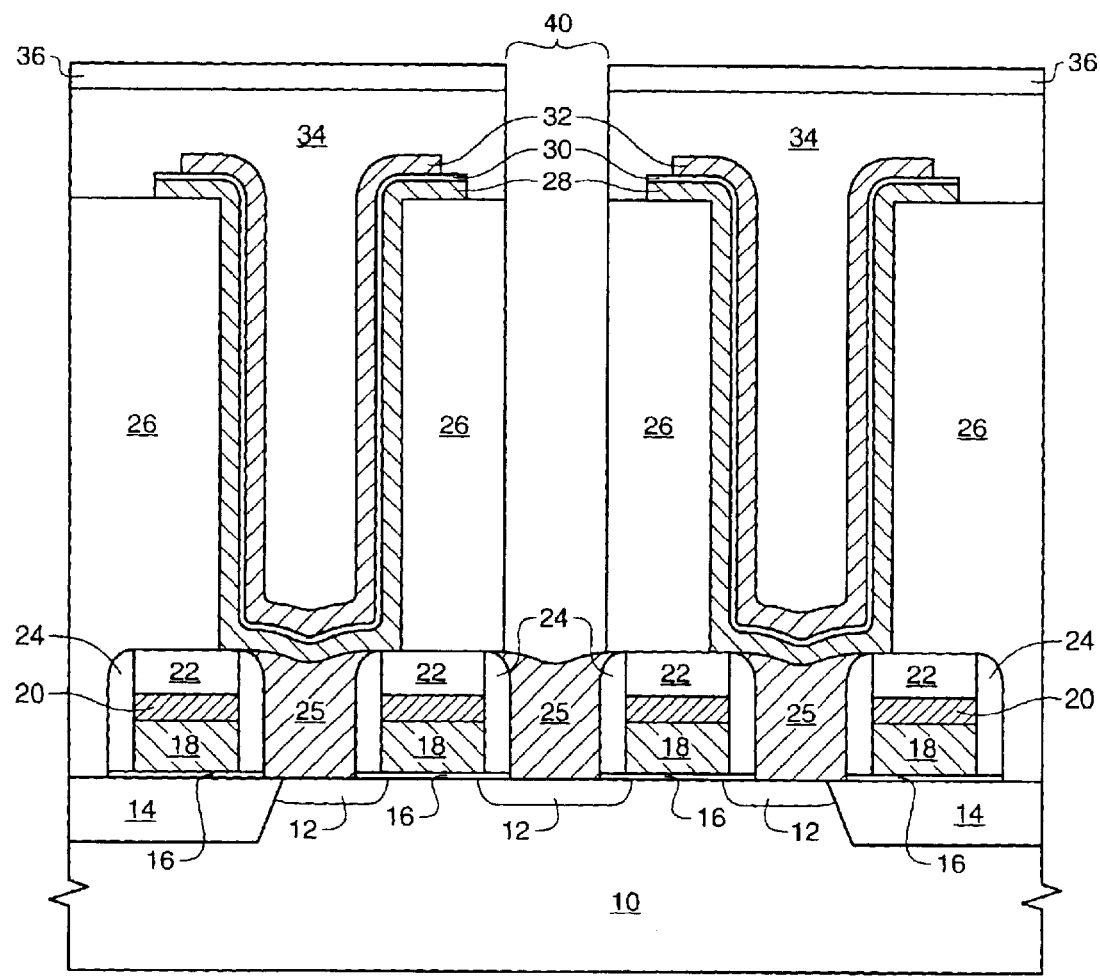
Figure 4:
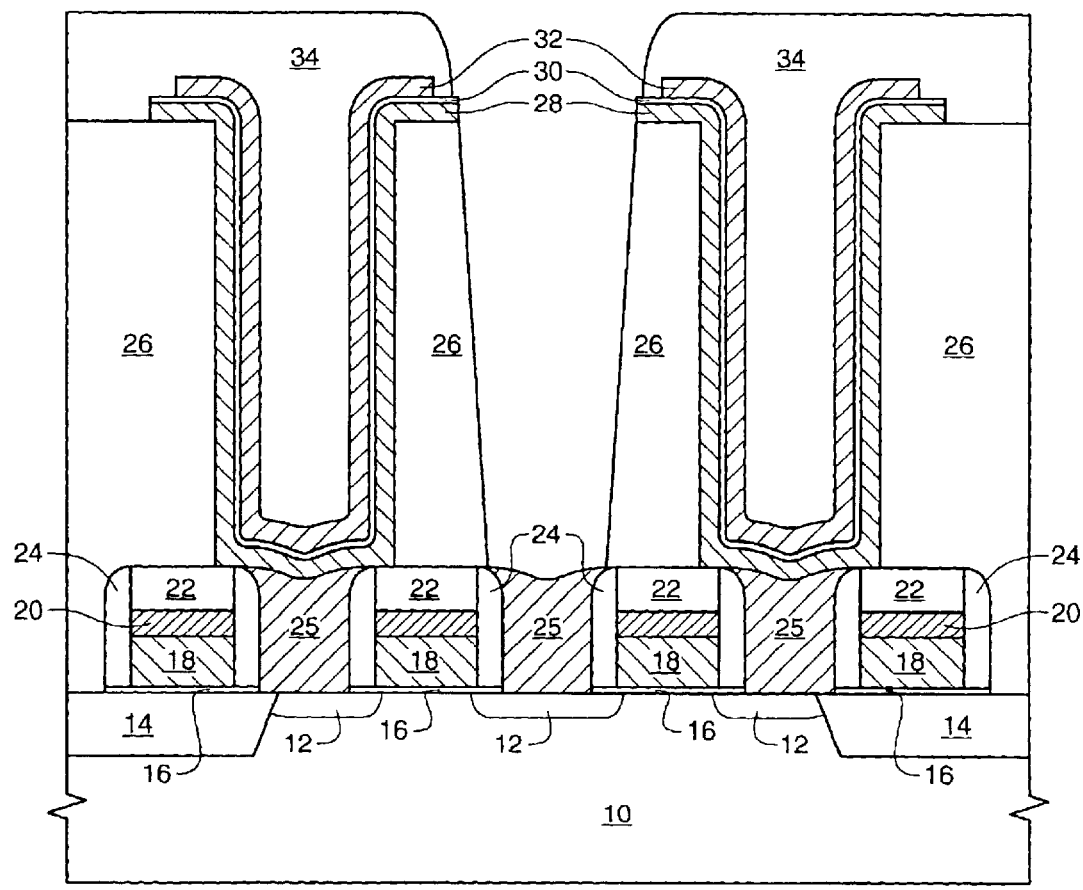
Figure 5:
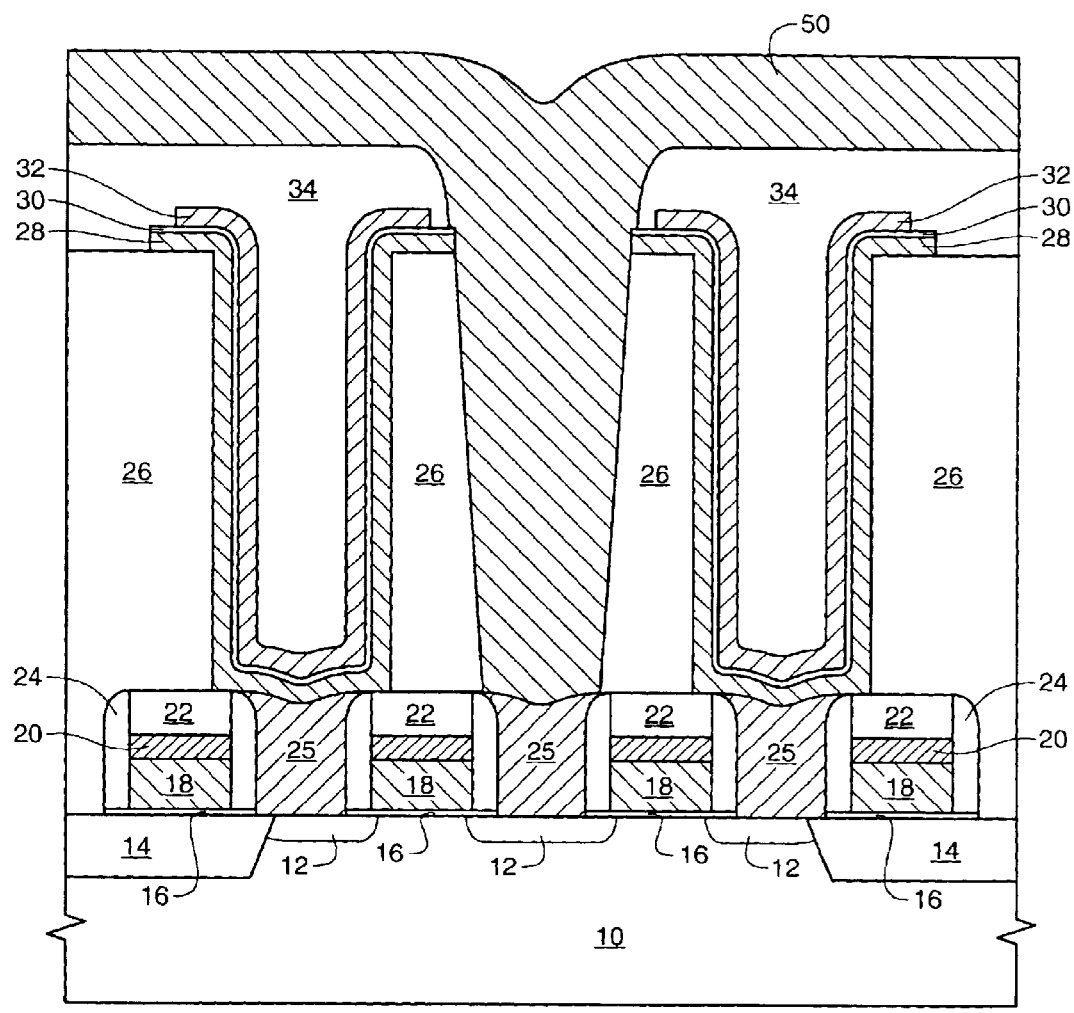
Figure 6:
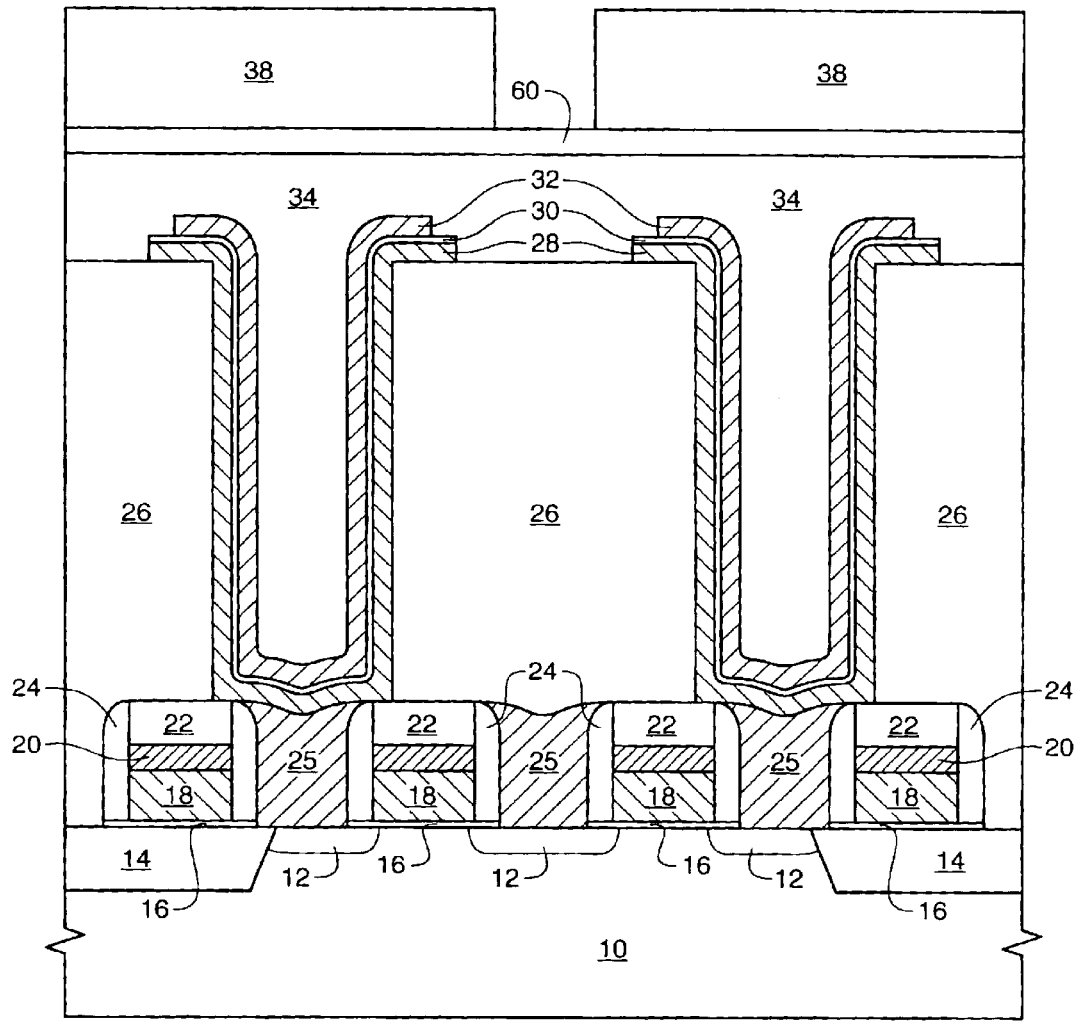
FIGS. 6–8 are cross sections of an embodiment of the present invention which removes an antireflective coating without exposure of an underlying layer such as a capacitor bottom plate.
Figure 7:
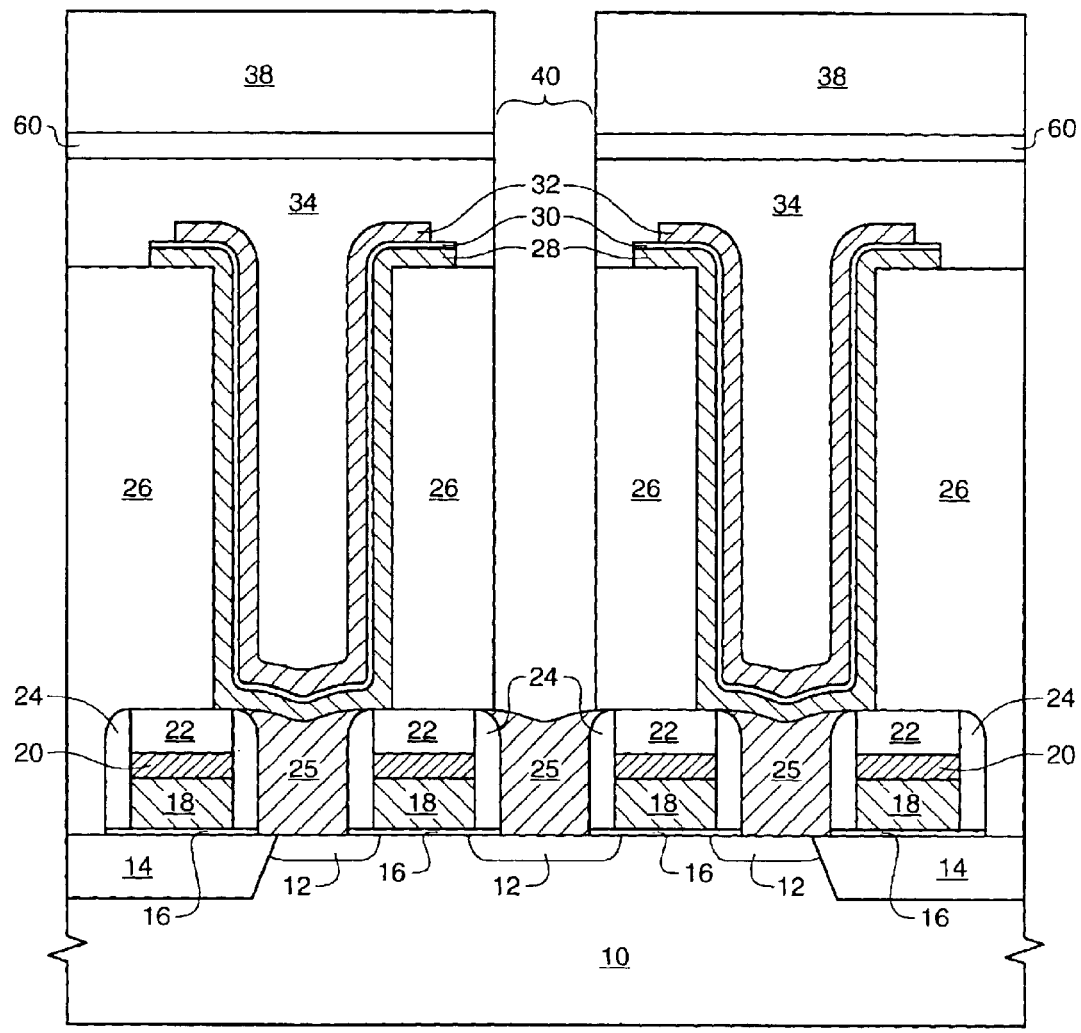
Figure 8:
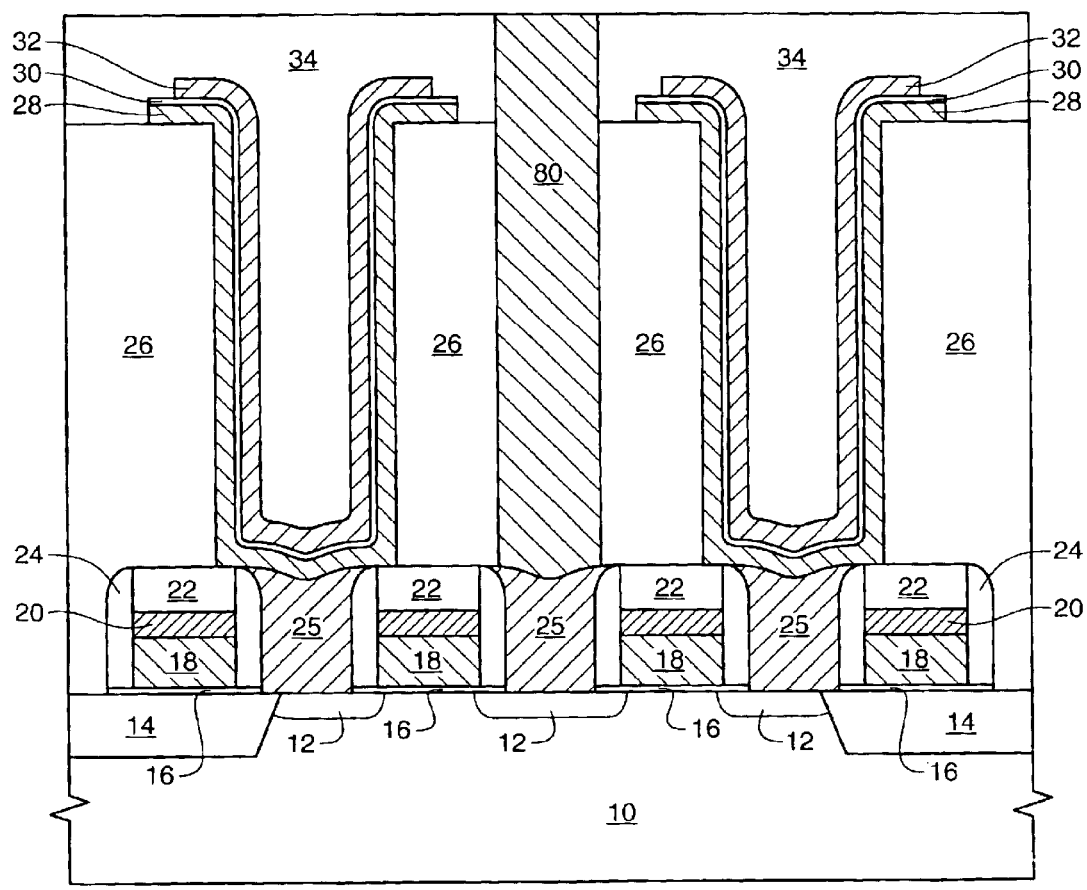

A process for forming a semiconductor device using an inventive dielectric antireflective coating (DARC) is depicted in FIGS. 6–8. The structure of FIG. 6 depicts a semiconductor wafer 10 having doped regions therein 12, shallow trench isolation (STI) 14, transistors comprising gate oxide 16, control gate 18, for example polysilicon, conductive enhancement layer 20, for example tungsten silicide, capping layer 22, and dielectric spacers 24. FIG. 1 further depicts conductive pads 25, dielectric base layer 26, for example borophosphosilicate glass (BPSG), storage capacitors comprising capacitor bottom plate 28, cell dielectric 30, and capacitor top plate layer 32. In addition, FIG. 1 depicts a second dielectric layer 34 comprising BPSG or tetraethyl orthosilicate (TEOS), an inventive DARC layer 60 and a patterned photoresist layer 38. During the exposure of photoresist layer 38 during photolithography, antireflective layer 60 decreases the reflection of light from the surface of dielectric layer 34 back into resist layer 38. Other structures may be formed during the manufacture of the structure of FIG. 6 which are not depicted for ease of explanation.

Antireflective coating 60 in this embodiment is manufactured from amorphous carbon doped with boron to a concentration of between about 0.1 atom % to about 10 atom %, and up to a maximum of about 20 atom %. An a-C:B film with about 10 atom % of boron has an "n" value of about 1.80 and a "k" value of about 0.51 with reference to a 248 nanometer wavelength light. The "n" and "k" values can be tuned to desired levels by varying the concentration of boron in the a-C:B layer. Boron-doped amorphous carbon (a-C:B) can be removed with an oxygen plasma ash step similar to that of photoresist, and may be removed during the removal of any photoresist remaining after etching the underlying layer, as will be discussed below.

The a-C:B layer 60 of FIG. 6 can be formed using a chemical vapor deposition (CVD) process. A semiconductor wafer is placed into a CVD chamber, then the chamber is set to a temperature of between about 200° C. and about 450° C., preferably about 375° C. At temperature, propylene ($C_3H_6$) is introduced into the chamber at a flow rate of between about 200 standard cubic centimeters per minute (sccm) and about 1,000 sccm, preferably about 650 sccm, along with diborane ($B_2H_6$) at a flow rate of between about 100 sccm and about 2,000 sccm, and more preferably between about 600 sccm and about 1,300 sccm and, optionally, helium (He) at a flow rate of between about 0.0 sccm and about 1,000 sccm, preferably about 0.0 sccm. (As is known by one of ordinary skill in the art, at a flow rate of 0.0 sccm some gas is injected into the chamber due to the lower chamber pressure with low pressure processes.) If used, the helium may assist in the formation of a more uniform layer. During the introduction of gasses, the CVD chamber is subjected to a radio frequency (RF) power of between about 300 watts (W) and about 1,000 W, preferably about 600 W, and a pressure of between about 3.0 torr (T) and about 7.0 T, preferably about 5.0 T. This process forms an a-C:B layer at a rate of about 2,500 angstroms (Å) per minute to about 5,500 Å per minute, depending on the gas flow rates and the rates of the other parameters as described above. A a-C:B antireflective layer between about 150 Å and about 500 Å is sufficient, and thus the process above is performed for between about 4.0 seconds and about 10 seconds. Table 1 summarizes these conditions when performed in an Applied Materials® (AMAT) Centura® chamber, and may need to be modified for other chambers. For example, in an AMAT Producer® chamber, the gas flows are increased.

TABLE 1

Summary of Variable Ranges to Form a
Boron-Doped Amorphous Carbon Layer
in an Applied Materials ® Centura ® Etch Chamber

| Variable | Broad Range | Narrow Range/Typical |
|---|---|---|
| Temperature | 200° C.–450° C. | 350° C.–400° C. |
| $C_3H_6$ flow rate | 200 sccm–1,000 sccm | 400 sccm–700 sccm |
| $B_2H_6$ flow rate | 100 sccm–2,000 sccm | 400 sccm–1,300 sccm |
| He flow rate | 0 sccm–1,000 sccm | 0 sccm–600 sccm |
| RF Power | 300 W–1,000 W | 450 W–700 W |
| Pressure | 3.0 T–7.0 T | 4.0 T–6.0 T |
| a-C:B formation rate | 2,500 Å/min–6,000 Å/min | 4,000 Å/min–5,500 Å/min |

The deposition process above dopes the amorphous carbon with boron to between about 0.1 atom percent (atom %) and about 20 atom %, more preferably to between about 1 atom % and about 15 atom %, and most preferably to between about 5 atom % and about 10 atom %, depending on the $B_2H_6$ flow rate relative to the flow rates of the propylene and (if used) helium. With benefit of the present description, alteration of the gas flow rates to result in the desired boron atom % can be accomplished by one of ordinary skill in the art.

As the atom % of boron increases, the film becomes more opaque. An atom % of greater than about 20% is not considered preferable for most uses, because as the boron concentration increases, it becomes more difficult to sufficiently etch the layer with an oxygen plasma in a process described below to form an opening in the ARC layer. With no boron doping in the amorphous carbon, the DARC layer will react with the photoresist to form a resist footing, and thus the resist layer cannot be formed directly on an amorphous carbon layer with no boron doping. Thus it is preferable to dope the amorphous carbon layer with boron to between about 0.1 atom % and about 20 atom %.

After formation of the FIG. 6 structure the DARC layer 60 is etched to expose BPSG layer 26, then the BPSG layer is etched to expose the underlying contact pad 25. This results in the FIG. 7 structure having an opening 40 in resist layer 38, ARC layer 60, and dielectric layers 34, 26 to expose contact pad 25. An a-C:B layer about 300 Å thick can be etched by exposing the a-C:B layer to an oxygen plasma for between about 3 seconds and about 10 seconds. The BPSG can be etched according to means known in the art.

After forming the structure of FIG. 7, an ash is performed by exposing the wafer to an oxygen plasma. This can be performed at a temperature of between about 200° C. and about 380° C. for between about 20 seconds and about 120 seconds. This ashes any remaining photoresist 38 and also ashes the DARC layer 60. Subsequently, the wafer can be exposed to a wet etch, such as to a QEtch II (1% phosphoric acid, 39% ammonium fluoride) for a duration of between about 15 seconds and about 60 seconds, or to a "piranha" etch (sulfuric acid and hydrogen peroxide) for a duration of between about 5 minutes and about 10 minutes. This removes the photoresist 36, DARC layer 60, and any polymer which may form within the opening 40. Finally, at least one metal layer is formed within the opening, for example by using a damascene process, to result in the plug 80 depicted in FIG. 8. It should be noted that the times listed herein may be different depending on the ash conditions and other etch conditions, and may be determined by one of ordinary skill in the art for any particular process.

During the ash of the a-C:B layer, adding fluorine to the oxygen plasma will increase the removal rate of the a-C:B layer. Thus it may be advantageous in some processes to expose at least the a-C:B layer to a fluorine-containing oxygen plasma. Fluorine may be introduced by the inclusion of a gas such as $CF_4$, $NF_3$, $CH_2F_2$ or $CHF_3$ into the oxygen plasma during the ashing.

The embodiments described above allow for an improved removal of an antireflective coating through the use of a material (a-C:B) which can be ashed along with the photoresist layer rather than requiring removal through the use of an acid or a dry etch which can damage BPSG, TEOS, or other dielectric.

Figure 9:
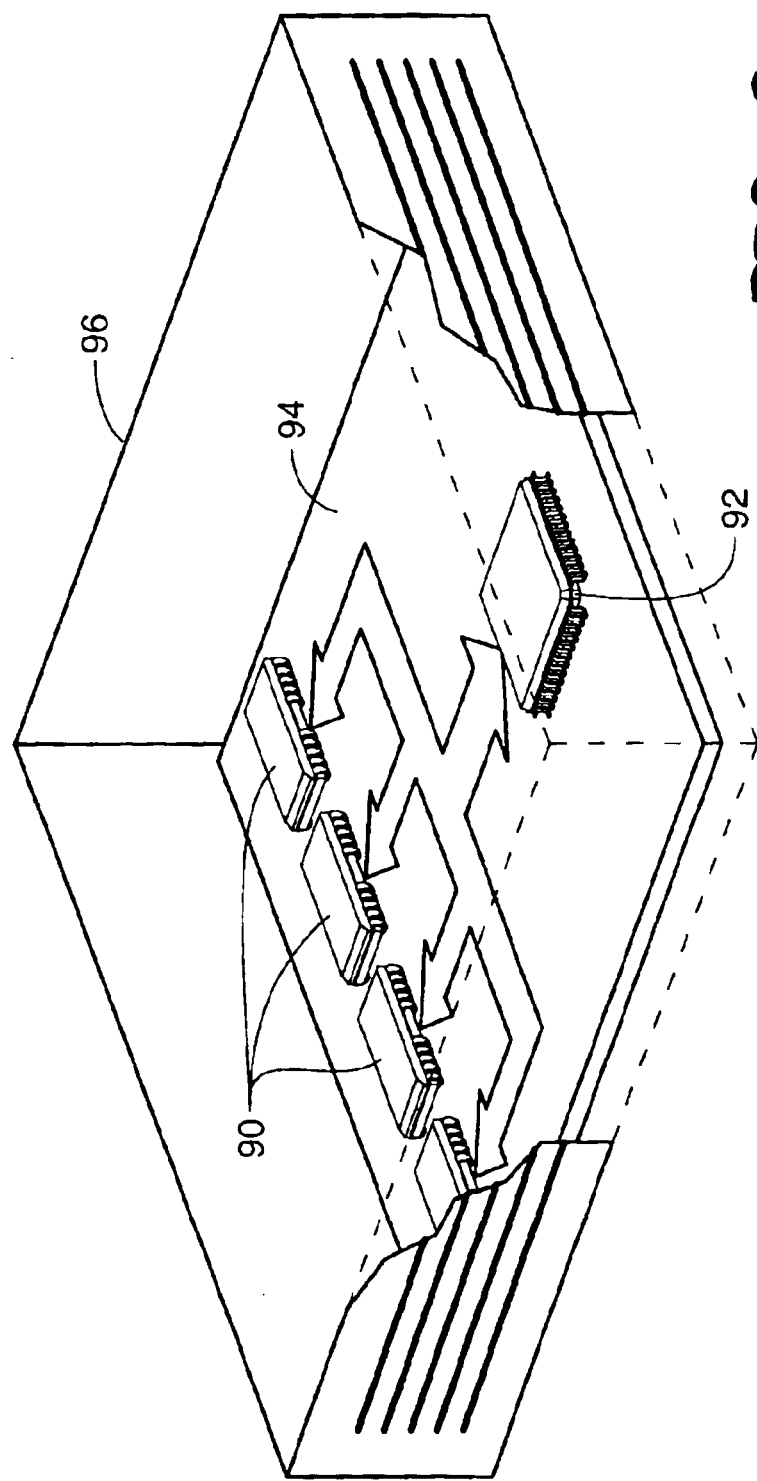
FIG. 9 is an isometric depiction of a use of the invention in an electronic device.

As depicted in FIG. 9, a semiconductor device 90 formed in accordance with the invention may be attached along with other devices such as a microprocessor 92 to a printed circuit board 94, for example to a computer motherboard or as a part of a memory module used in a personal computer, a minicomputer, or a mainframe 96. FIG. 9 may also represent use of device 90 in other electronic devices comprising a housing 96, for example devices comprising a microprocessor 92, related to telecommunications, the automobile industry, semiconductor test and manufacturing equipment, consumer electronics, or virtually any piece of consumer or industrial electronic equipment.

Figure 10:
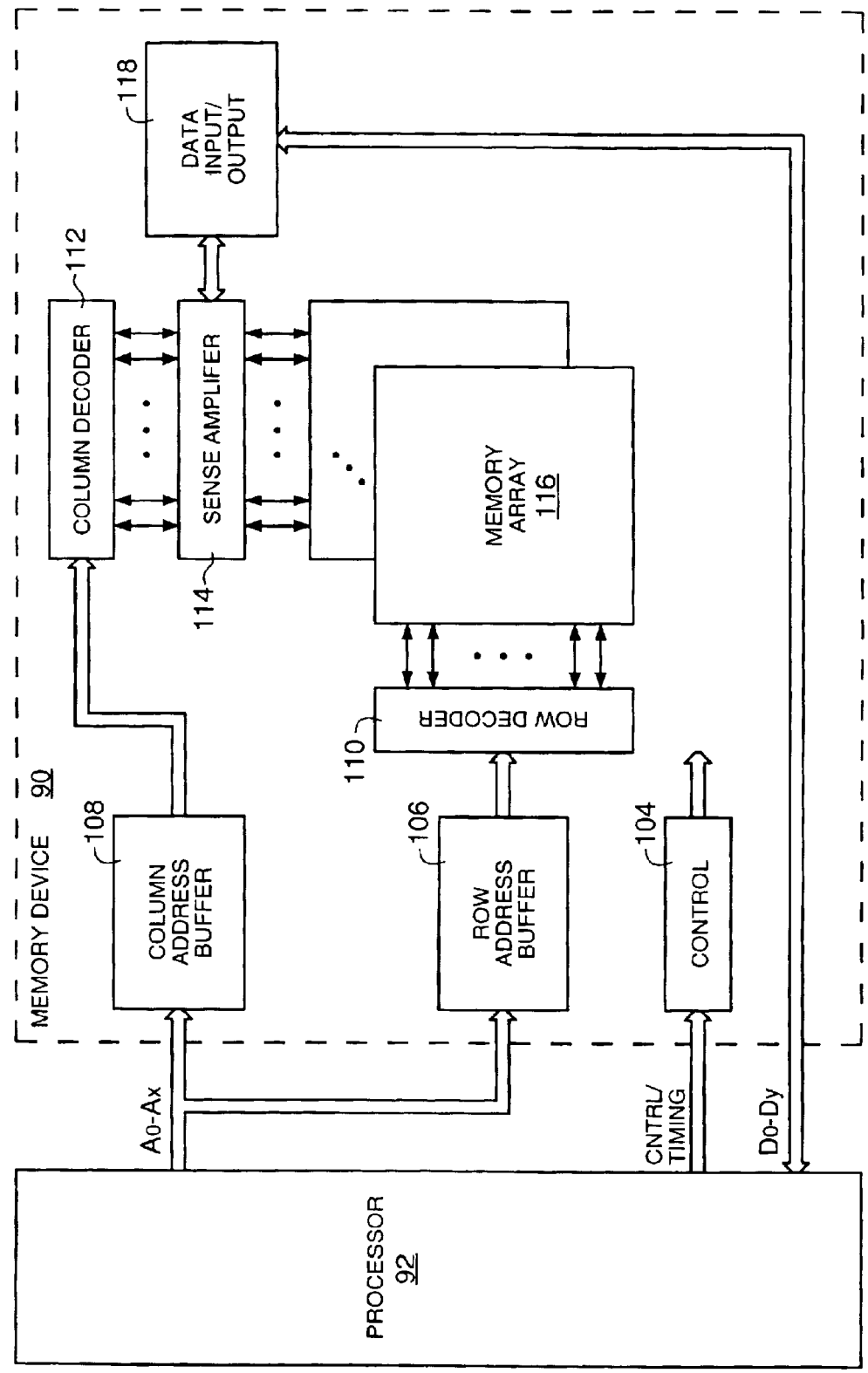
FIG. 10 is a block diagram of an exemplary use of the invention to form part of a memory array in a dynamic random access memory.

The process and structure described herein can be used to manufacture a number of different structures which comprise a structure formed using a photolithographic process. FIG. 10, for example, is a simplified block diagram of a memory device such as a dynamic random access memory having digit lines and other features which may be formed using an embodiment of the present invention. The general operation of such a device is known to one skilled in the art. FIG. 10 depicts a processor 92 coupled to a memory device 90, and further depicts the following basic sections of a memory integrated circuit: control circuitry 104; row 106 and column 108 address buffers; row 110 and column 112 decoders; sense amplifiers 114; memory array 116; and data input/output 118.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. While the description above describes the use of the a-C:B layer as a DARC layer during the formation of a digit line contact opening, the inventive DARC layer can be used in many processes, for example during the etch of a dielectric to define capacitor bottom plates, during an etch to define the word lines, or during any patterning etch with which an antireflective layer is useful. It is therefore contemplated that the appended claims will cover any such modifications or embodiments as fall within the true scope of the invention.

What is claimed is:

1. A method used to form a semiconductor device comprising:
    forming a layer to be etched over a semiconductor wafer substrate assembly;
    forming a boron-doped amorphous carbon (a-C:B) antireflective coating (ARC) layer over said layer to be etched;
    patterning said a-C:B ARC layer to expose said layer to be etched;
    etching said layer to be etched to pattern said layer; then
    exposing said a-C:B ARC layer to an oxygen plasma; and
    introducing a fluorine-containing gas into said oxygen plasma during said exposure of said a-C:B ARC layer to said oxygen plasma.

2. The method of claim 1 further comprising heating said a-C:B ARC layer to a temperature of between about 200° C. and about 380° C. during said exposure of said ARC layer to said oxygen plasma.

3. The method of claim 2 further comprising exposing said ARC layer to said oxygen plasma for a duration of between about 20 seconds and about 120 seconds.

4. The method of claim 1 further comprising:
    prior to patterning said a-C:B ARC layer, forming a patterned photoresist layer over said a-C:B ARC layer:
    patterning said a-C:B ARC layer using said patterned photoresist layer as a pattern during said patterning of said a-C:B arc layer to expose said layer to be etched; and
    exposing both said photoresist layer and said a-C:B ARC layer to said oxygen plasma.

5. The method of claim 1 wherein said layer to be etched is a dielectric layer and said method further comprises:
    forming an opening in said dielectric layer during said etching of said layer to be etched; and
    subsequent to exposing said a-C:B ARC layer to said oxygen plasma, forming a conductive layer within said opening in said dielectric layer.

6. The method of claim 1 wherein said exposure of said a-C:B ARC layer to said oxygen plasma forms an ashed a-C:B layer and said method further comprises exposing said ashed a-C:B layer to a solution comprising both phosphoric acid and ammonium fluoride.

7. A method for patterning a layer to be etched which overlies a semiconductor wafer, comprising:
   forming a boron-doped amorphous carbon layer on said layer to be etched;
   forming a photoresist layer on said boron-doped amorphous carbon layer;
   patterning said photoresist layer and said boron-doped amorphous carbon layer;
   etching said layer to be etched to pattern said layer to be etched using said pattern of said patterned boron-doped amorphous carbon layer as a pattern; and
   removing said photoresist layer and said boron-doped amorphous carbon layer by:
      exposing said photoresist layer and said boron-doped amorphous carbon layer to an oxygen plasma to form an ashed photoresist layer and an ashed boron-doped amorphous carbon layer subsequent to etching said layer to be etched; and
      exposing said ashed photoresist layer and said ashed boron-doped amorphous carbon layer to an acid.

8. The method of claim 7 further comprising introducing a fluorine-containing gas into said oxygen plasma during said exposure of said boron-doped amorphous carbon layer to said oxygen plasma.

9. The method of claim 7 further comprising exposing said ashed photoresist layer and said ashed boron-doped amorphous carbon layer to a solution comprising phosphoric acid and ammonium fluoride during said exposure of said ashed photoresist layer and ashed said boron-doped amorphous carbon layer to said acid.

10. A method used to form a semiconductor device, comprising:
   forming a layer to be etched over a semiconductor wafer substrate assembly;
   forming an amorphous carbon layer over the layer to be etched by:
      placing the semiconductor wafer substrate assembly into a chamber;
      heating the chamber to a temperature of between about 200° C. and about 450°C.;
      introducing propylene into the heated chamber at a flow rate of between about 200 standard cm$^3$/minute (sccm) and about 1.000 sccm, diborane at a flow rate of between about 100 sccm and about 2,000 sccm, and helium at a flow rate of between about 0.0 sccm and 1,000 sccm and;
      during the introduction of propylene, diborane, and helium into the heated chamber, subjecting the chamber to a radio frequency power of between about 300 watts (W) and about 1,000 W and a pressure of between about 3.0 torr (T) and about 7.0 T to result in an amorphous carbon layer doped with boron to between about 0.1 atom % and about 20 atom %;
   forming a patterned photoresist layer over the amorphous carbon layer;
   patterning the amorphous carbon layer using the patterned photoresist layer as a pattern;
   etching the layer to be etched using the pattern of the photoresist layer as a pattern; and
   subsequent to etching the layer to be etched, exposing the amorphous carbon layer to an oxygen plasma to remove the amorphous carbon layer.

11. The method of claim 10 wherein the amorphous carbon layer is doped with boron to between about 1 atom % and about 10 atom %.

12. The method of claim 10 wherein the amorphous carbon layer is doped with boron to between about 5 atom % and about 10 atom %.

13. The method of claim 10 further comprising exposing the semiconductor wafer substrate assembly to a wet etch for a duration of between about 5 minutes and about 10 minutes subsequent to exposing the amorphous carbon layer to the oxygen plasma.

14. The method of claim 10 further comprising exposing the amorphous carbon layer to a fluorine-containing oxygen plasma during the exposure of the amorphous carbon layer to the oxygen plasma.

15. The method of claim 10 further comprising introducing a material selected from the group consisting of $CF_4$, $NF_3$, $CH_2F_2$, and $CHF_3$ to the oxygen plasma during the exposure of the amorphous carbon layer to the oxygen plasma.

16. The method of claim 10 further comprising removing the patterned photoresist layer during the exposure of the amorphous carbon layer to the oxygen plasma.

17. A method used to form a semiconductor device comprising:
   forming a dielectric layer over a semiconductor wafer substrate assembly;
   forming a boron-doped amorphous carbon (a-C:B) antireflective coating (ARC) layer over said dielectric layer;
   patterning said a-C:B ARC layer to expose said dielectric layer;
   etching said dielectric layer to pattern said dielectric layer and to form an opening therein; then
   exposing said a-C:B ARC layer to an oxygen plasma: and
   subsequent to exposing said a-C:B ARC layer to said oxygen plasma, forming a conductive layer within said opening in said dielectric layer.

18. A method used to form a semiconductor device comprising:
   forming a layer to be etched over a semiconductor wafer substrate assembly;
   forming a boron-doped amorphous carbon (a-C:B) antireflective coating (ARC) layer over said layer to be etched;
   patterning said a-C:B ARC layer to expose said layer to be etched;
   etching said layer to be etched to pattern said layer: then
   exposing said a-C:B ARC layer to an oxygen plasma to form an ashed a-C:B layer; and
   exposing said ashed a-C:B layer to a solution comprising both phosphoric acid and ammonium fluoride.

19. A method used to form a semiconductor device, comprising:
   forming a layer to be etched over a semiconductor wafer substrate assembly;
   forming a amorphous carbon layer over the layer to be etched, wherein the amorphous carbon layer is doped with boron to between about 0.1 atom % and about 20 atom %:
   forming a patterned photoresist layer over the amorphous carbon layer;
   patterning the amorphous carbon layer using the patterned photoresist layer as a pattern;

etching the layer to be etched using the pattern of the photoresist layer as a pattern;

subsequent to etching the layer to be etched, exposing the amorphous carbon layer to an oxygen plasma to remove the amorphous carbon layer; and exposing the semiconductor wafer substrate assembly to a wet etch for a duration of between about 5 minutes and about 10 minutes subsequent to exposing the amorphous carbon layer to the oxygen plasma.

20. A method used to form a semiconductor device, comprising:

forming a layer to be etched over a semiconductor wafer substrate assembly;

forming a amorphous carbon layer over the layer to be etched, wherein the amorphous carbon layer is doped with boron to between about 0.1 atom % and about 20 atom %;

forming a patterned photoresist layer over the amorphous carbon layer;

patterning the amorphous carbon layer using the patterned photoresist layer as a pattern;

etching the layer to be etched using the pattern of the photoresist layer as a pattern;

subsequent to etching the layer to be etched, exposing the amorphous carbon layer to a fluorine-containing oxygen plasma to remove the amorphous carbon layer.

21. A method used to form a semiconductor device, comprising:

forming a layer to be etched over a semiconductor wafer substrate assembly;

forming a amorphous carbon layer over the layer to be etched, wherein the amorphous carbon layer is doped with boron to between about 0.1 atom % and about 20 atom %;

forming a patterned photoresist layer over the amorphous carbon layer;

patterning the amorphous carbon layer using the patterned photoresist layer as a pattern;

etching the layer to be etched using the pattern of the photoresist layer as a pattern;

subsequent to etching the layer to be etched, exposing the amorphous carbon layer to an oxygen plasma to remove the amorphous carbon layer; and introducing a material selected from the group consisting of $CF_4$, $NF_3$, $CH_2F_2$, and $CHF_3$ to the oxygen plasma during the exposure of the amorphous carbon layer to the oxygen plasma.

* * * * *